United States Patent [19]
Ishii et al.

[11] Patent Number: 5,280,641
[45] Date of Patent: Jan. 18, 1994

[54] SIGNAL-STRENGTH-PEAK DETECTING CIRCUIT FOR AUTOMATIC TUNING CIRCUIT

[75] Inventors: Hisao Ishii, Ashikaga; Shinichi Yamasaki, Gunma, both of Japan

[73] Assignee: Sanyo Electric Co., Ltd., Osaka, Japan

[21] Appl. No.: 723,079

[22] Filed: Jun. 28, 1991

[30] Foreign Application Priority Data

Jun. 29, 1990 [JP] Japan .................... 2-171846

[51] Int. Cl.$^5$ .......................... H04B 17/00
[52] U.S. Cl. .................. 455/182.3; 455/192.3; 455/226.2
[58] Field of Search ......... 455/182.2, 182.3, 192.2, 455/192.3, 179.1, 233.1, 190.1, 226.2

[56] References Cited

U.S. PATENT DOCUMENTS

| | | | |
|---|---|---|---|
| 2,084,379 | 6/1937 | Braden | 455/233.1 |
| 4,264,977 | 4/1981 | Deiss . | |
| 4,334,323 | 6/1982 | Moore | 455/179.1 |
| 4,383,333 | 5/1983 | Erickson | 455/192.3 |
| 4,435,841 | 3/1984 | Dobrovolny | 455/190.1 |
| 4,955,073 | 9/1990 | Sugayama . | |

FOREIGN PATENT DOCUMENTS 333194 9/1989 European Pat. Off. .

Primary Examiner—Reinhard J. Eisenzopf
Assistant Examiner—Mark D. Wisler
Attorney, Agent, or Firm—Armstrong, Westerman, Hattori, McLeland & Naughton

[57] ABSTRACT

In a signal-strength-peak detecting circuit, tuning frequencies by a tuning circuit are periodically varied. Wide band seek is performed according to a signal level of the varied frequencies. When the signal level is greater than a predetermined value, a fine tuning circuit varies tuning frequencies to perform narrow band seek. Further, change of signal levels is detected during narrow band seek to decide whether the peak of the signal level is trapezoidal or rounded. When the peak is decided to be rounded, the maximum value is used as the peak. On the other hand, when the peak is decided to be trapezoidal, the central point of an upper side of the trapezoid is selected as an optimum peak.

9 Claims, 14 Drawing Sheets

SIGNAL-STRENGTH-PEAK DETECTING CIRCUIT FOR AUTOMATIC TUNING CIRCUIT

BACKGROUND OF THE INVENTION

1. Field of the Invention

This invention relates to an AM radio receiver a and more particularly, to an AM radio receiver free from tracking errors.

2. Description of the Related Art

There is currently known an AM radio receiver which receives AM broadcasting waves (RF signals) transmitted from broadcasting stations as described in "Bipolar Integrated Circuit for Automobile Audio Receiver" on page 73 of '88 Sanyo Semiconductor Data Book (CQ Publishing Co., Ltd.).

FIG. 1 of the accompanying drawings shows a conventional radio receiver similar to the radio receiver described above. The radio receiver comprises an antenna 10 for receiving RF signals, an antenna damping circuit 12 for attenuating the received RF signals, an RF amplifier 18 including an FET 14 for amplifying the attenuated RF signals and AGC transistor 16 for receiving AGC signals at its base, an RF tuner 20, a mixer MIX 24 for mixing the RF signal from the RF tuner 20 and local oscillator signals from a local oscillator (L. OSC) 22, an IF amplifier (IF) 26 for amplifying IF (intermediate frequency) signals from the mixer 24, and an AM detector 28 for performing AM detection of output signals from the IF amplifier 26.

Such a radio receiver is designed so that the difference between a resonance frequency $f_{RF}$ of the RF tuner 20 and the resonance frequency $f_{OSC}$ of the local oscillator 22 are equal to an IF signal frequency ($f_{IF}=450$ KHz).

To perform automatic tuning, a tuning signal $V_T$ to be applied to the RF tuner 20 is initially varied in accordance with an inter-station frequency. The inter-station frequency represents a minimum spacing between waves transmitted from respective broadcasting stations. The frequencies used by the respective broadcasting stations should be separated by the predetermined spacing to prevent any interference between the broadcasting waves. Usually, specific broadcasting frequencies are respectively assigned to the broadcasting stations. During automatic tuning, an IF signal for each station internal frequency is detected to seek a broadcasting station having a signal strength greater than a predetermined value.

However, in the conventional radio receiver, an adjustment is made for frequencies which tune only at a few discrete tracking points (e.g. 600 KHz, 1000 KHz, 1400 KHz) in a receiving frequency band. As shown in FIG. 3, at the other receiving frequencies, tuning points of the RF tuner deviate from frequencies of the broadcasting waves determined for every station internal frequency, thereby causing tracking errors.

In the conventional AM radio receiver, gain of the RF amplifier tends to be deteriorated. With an AM stereo radio receiver, separation is sometimes worsened. Further, there has been a problem that automatic tuning cannot be always stopped stably at an optimum point. These problems are remarkable at frequencies (522 KHz to 600 KHz) which are lower than the first tracking point (600 KHz), and at frequencies (1400 KHz to 1602 KHz) which are higher than the third tracking point (1400 KHz).

With the conventional art in which RF tuning is performed by the tuning signal $V_T$ determined according to station internal frequencies, the RF tuning circuit is not always tuned to the maximum point of the signal strength.

SUMMARY OF THE INVENTION

It is therefore an object of this invention to provide a signal-strength-peaking detecting circuit, for an automatic tuning circuit, which is free from tracking errors and can be tuned to a peak point of signal strength to assure optimum reception of broadcast signals.

According to one embodiment of this invention, there is provided a circuit for detecting a peak of signal strength in an automatic tuning circuit for automatically tuning in to a broadcasting station having a signal strength greater than a predetermined value, said detecting circuit comprising: an RF tuning circuit for transmitting a received signal in a tuned state; an RF non-tuning circuit for transmitting a received signal in a non-tuned state; a local oscillator circuit for outputting a local oscillator signal; a tuned frequency variable circuit for varying, in predetermined changing steps, the tuned frequency of said RF tuning circuit and the frequency of the local oscillator signal of said local oscillator circuit; a selector circuit for selecting the output signal of said RF non-tuning circuit during an automatic tuning process and for selecting the output signal of said RF tuning circuit after termination of automatic tuning; a signal strength detector for detecting the signal strength of the received signal; a fine tuning circuit for varying, the tuned frequency of said RF tuning circuit after termination of the tuning within the changing steps in said tuned frequency variable circuit; a gradient decision circuit for deciding a gradient of change of signal strength based on the signal strength obtained from said signal strength detector when the tuned frequency is varied by said fine tuning circuit; a peak detector for detecting a peak of signal strength based on the result of the decision of said gradient decision circuit; and a peak discriminating circuit for discriminating an optimum peak point among the peaks detected by said peak detector.

A gradient of change of signal strength can be decided based on the signal strength obtained by varying the tuning signal in very fine steps. An optimum peak point of the signal strength is detected according to the decision made by the gradient decision circuit, thereby allowing automatic tuning in to a broadcasting station under the optimum condition.

The signal-strength-peak detecting circuit further comprises means for deciding whether the signal strength detected by the signal strength detector in one tuned frequency in the tuned frequency variable circuit is greater than a predetermined value. The deciding means is operable to activate the fine tuning circuit when the result of the decision by the gradient decision circuit is greater than the predetermined value.

When the peak is determined to be trapezoidal in shape as the result of the decision by the gradient decision circuit, the peak discriminating circuit discriminates a central point of an upper side of the trapezoid as an optimum peak.

When the peak is determined to be rounded as the result of the decision by the gradient decision circuit, the peak discriminating circuit discriminates an apex of the rounded peak as an optimum peak.

When the peak is decided to have both trapezoidal and rounded characteristics as the result of the decision by the gradient decision circuit, the peak discriminating circuit discriminates one of two peaks formed by a combination of the trapezoidal and rounded characteristics whose maximum value is greater as an optimum peak.

The detecting circuit further includes an analog-to-digital converter for converting the result of detection by the signal strength detector into digital data, and a memory for storing output digital data of the analog-to-digital converter. The gradient decision circuit is operable to read and compare the data from the memory, to decide the gradient.

According to this invention, the signal-strength-peak detecting circuit can detect either a rounded peak or a trapezoidal peak based on the gradient of change of the signal strength, discriminate a peak generating signal to tune a tuning signal in to the peak generating point. Therefore, PLL tuning precision can be improved to tune in a optimum receiving point.

Further, when the peak is decided to be trapezoidal in shape as the result of decision, the peak discriminating circuit discriminates a central point of an upper side of the trapezoid as an optimum peak. Therefore, the signal-strength-peak detecting circuit can detect peaks very precisely, which cannot be accomplished by a simple peak hold.

DETAILED DESCRIPTION OF THE PREFERRED EMBODIMENT

Figure 1:
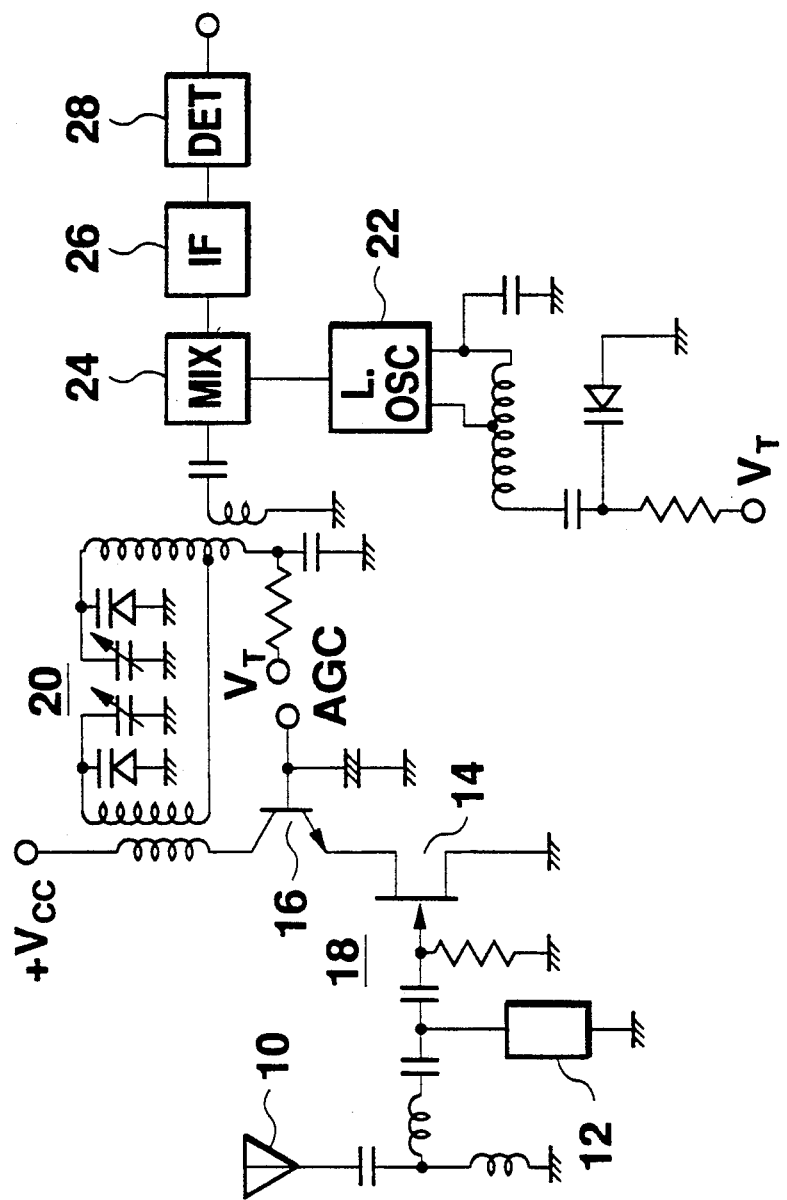
FIG. 1 is a circuit diagram of a conventional AM radio receiver.
Figure 2:
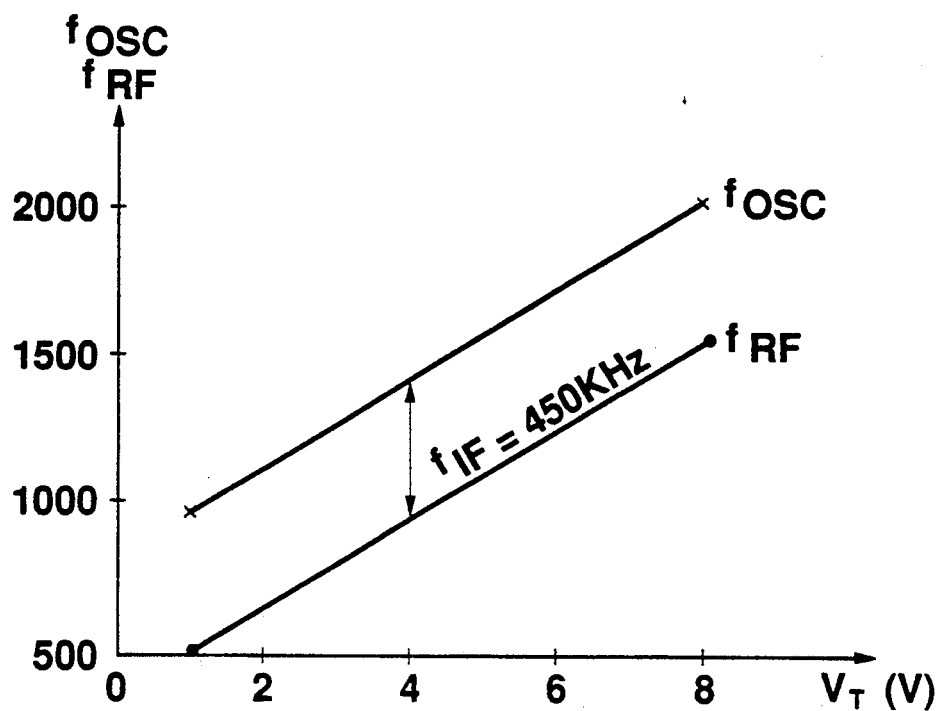
FIG. 2 shows IF frequencies.
Figure 4A:
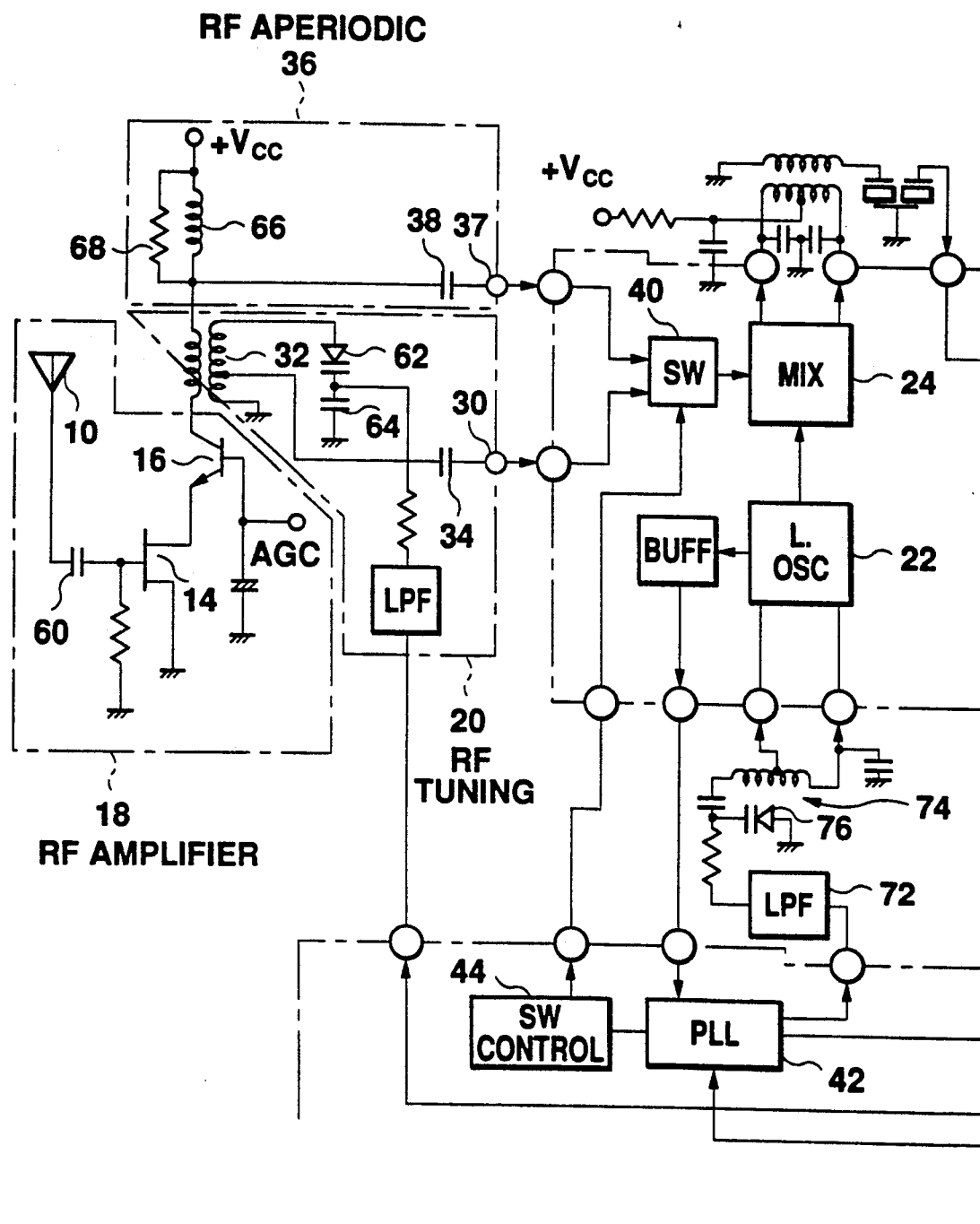
FIG. 4A and FIG. 4B show a circuit diagram of an AM radio receiver including a signal-strength-peak detecting circuit according to an embodiment of this invention.
Figure 4B:
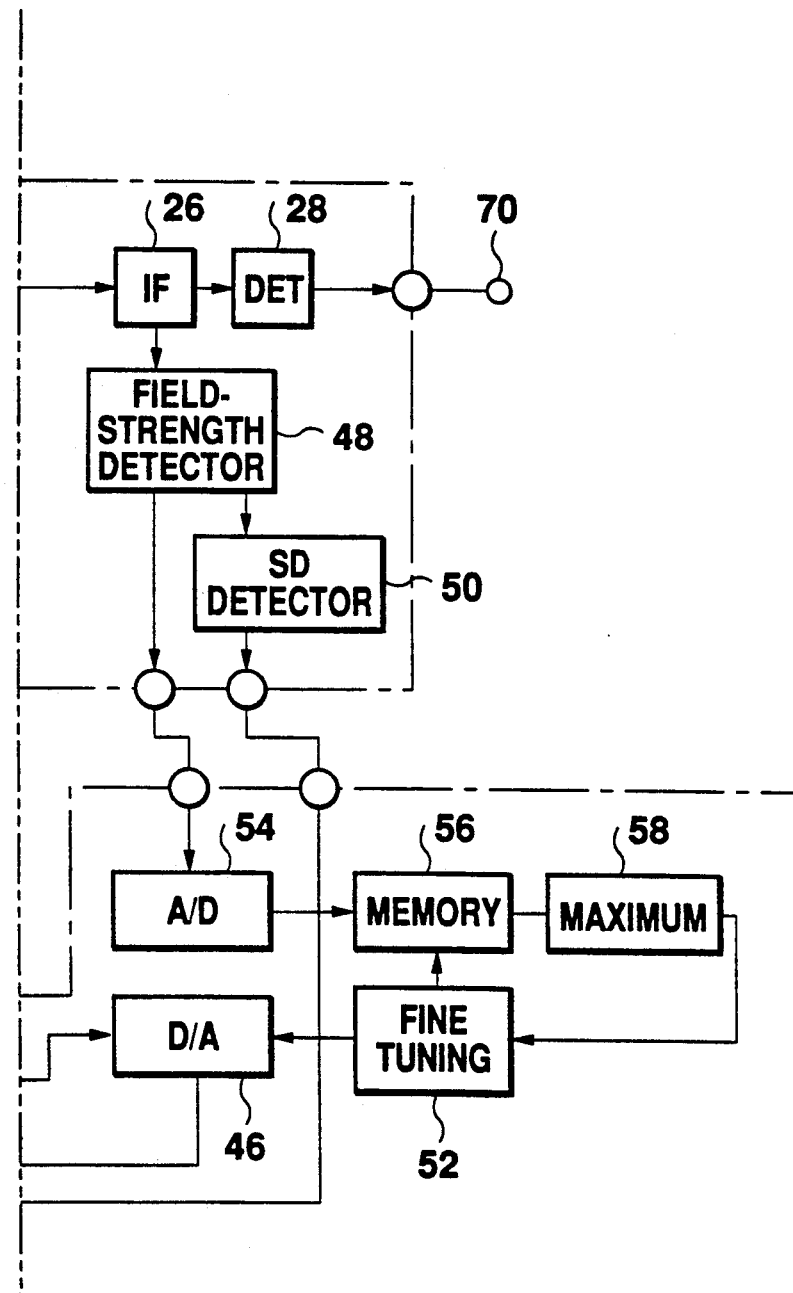

An AM radio receiver including a signal-strength-peak detecting circuit has the circuit configuration as shown in FIG. 4A and FIG. 4B. In FIG. 4A and FIG. 4B, components which are identical or similar to those shown in FIG. 1 are given the same reference numerals and will not be described in detail.

As shown in FIG. 4A and FIG. 4B, a first RF output terminal 30 is connected via a capacitor 34 to an intermediate tap of a secondary coil 32 composing an RF tuning circuit 20. An RF aperiodic circuit 36 and a second RF output terminal 37 are connected to a collector line of an AGC transistor 16 via a capacitor 38. A switching circuit (SW) 40 selects an RF output signal produced at the first or second RF output terminal.

A local oscillator (L. OSC) 22 and a mixer (MIX) 24 mix the RF signal obtained from the switching circuit 40 and the output signal from the local oscillator 22 to generate a 450-KHz IF signal. An IF amplifier (IF) 26 amplifies the IF signal. An AM detector (DET) 28 performs AM detection for the amplified IF signal.

A PLL circuit 42 controls a tuning frequency of the RF tuning circuit 20 and an oscillation frequency of the local oscillator 22. An SW control 44 generates a control signal for switching the switching circuit SW 40 during automatic tuning. A digital-to-analog converter (D/A) 46 converts a digital tuning signal from the PLL circuit 42 to an analog signal to apply it to the RF tuning circuit 20.

An electric field strength detector 48 detects an electric field strength of received signals. When the field strength detector 48 detects a level greater than the predetermined level during automatic tuning, a station detector (SD) 50 sends the PLL circuit 42 a signal indicating presence of a broadcast wave (station detected), thereby preventing the tuning signal and the locally oscillated signal frequency from being varied.

While monitoring the electric field strength obtained from the field strength detector 48, a fine tuning circuit 52 varies the tuning signal in the digital-to-analog converter 46, determining a tuning signal for maximizing the electric field strength. Specifically, an analog-to-digital converter (A/D) 54 converts, into a digital signal, the signal indicating the electric field strength from the field strength detector. According to the fine tuning signal from the fine tuning circuit 52, a memory 56 stores the digital signal which is changing in succession. A maximum value detector 58 detects a maximum electric field strength based on the digital signal stored in the memory 56. The detected maximum value is applied to the digital-to-analog converter 46 via the fine tuning circuit 52.

In operation, an RF signal received by an antenna 10 is applied to a gate of FET 14 via a capacitor 60 to be amplified. The amplified RF signal is picked up, via an emitter-collector path of the AGC transistor 16, from the RF tuning circuit 20 serving as a load, and is introduced to the first RF output terminal 30. Since the tuning frequency is determined by the secondary coil 32 and a capacitor 64 of a variable capacitance diode 62, the RF signal obtained at the first RF output terminal 30 has a narrow band (hereinafter called "the tuned output signal").

The RF signal obtained at a collector of the AGC transistor 16 is picked up by a parallel circuit including a coil 66 and a resistor 68, and is introduced to the second RF output terminal 37. This RF signal is not subject to band limitation and has a very wide band (hereinafter this signal is called "the aperiodic signal").

When a non-illustrated automatic tuning button is operated, the PLL circuit 42 is put in the automatic tuning mode, thereby starting selection of a broadcasting station. During automatic tuning, an oscillation frequency of the local oscillator 22 is varied in response to the output signal from the PLL circuit 42. Specifically, an output signal frequency of the local oscillator 22 is determined based on a control signal to be applied to a resonance circuit 74 from the PLL circuit 42 via a low-pass filter 72. The PLL circuit 42 changes this control signal according to inter-station frequencies during automatic tuning.

Figure 5:
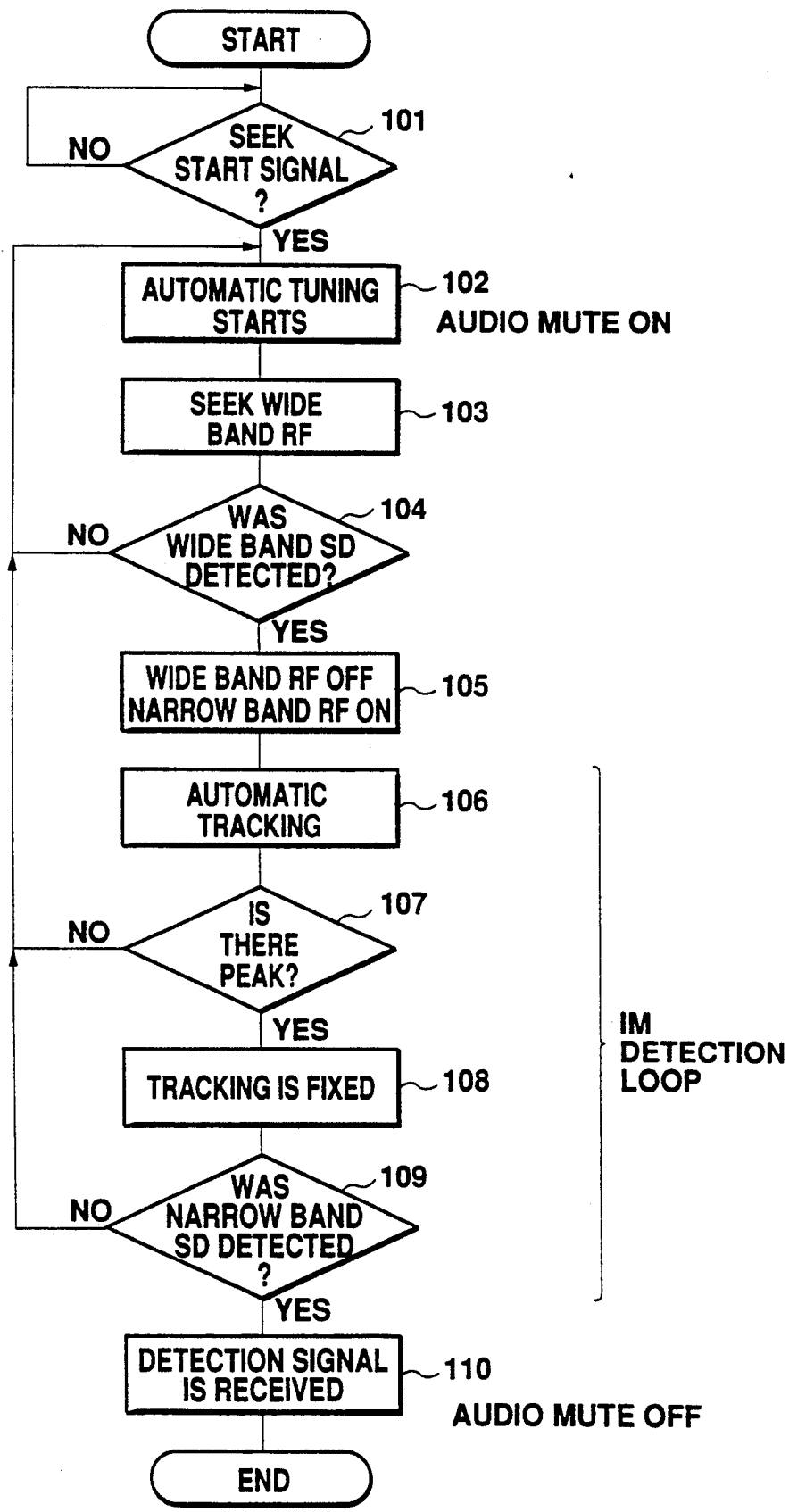
FIG. 5 is a flow chart describing the operation sequence of the AM radio receiver of FIG. 4.

When a broadcasting station is detected by a station detector 50, the variation of the oscillation frequency is stopped. The foregoing operation will be described with reference to the flow chart shown in FIG. 5.

The automatic tuning circuit is on standby until a seek start signal is inputted after depression of the automatic tuning button (step 101). During automatic tuning, a non-illustrated muting circuit is turned on to interrupt an output signal from an audio output terminal 70.

Firstly, the switch control unit 44 outputs the control signal "H" to the switching circuit 40. The switching circuit 40 selects the aperiodic signal at the second RF terminal, applying the signal to the mixer 24. The mixer 24 mixes the aperiodic signal with the output signal from the local oscillator 22 to generate an IF signal of 450 KHz (step 103, called "wide band RF seek"). At this time, the output signal from the local oscillator 22 is controlled by the PLL circuit 42 as described above, and is varied in a stepped manner for each station internal frequency. The control signal from the PLL circuit is varied periodically as predetermined.

Strength of the IF signal is detected by the electric field strength detector 48. A broadcasting station is detected depending upon whether or not the signal strength is equal to or more than the predetermined value (wide band station detection, step 104).

When a broadcasting station is detected, the station detector 50 sends the PLL circuit 42 a signal for stopping the frequency variation of the local oscillator signal. Thereafter, the local oscillation signal is fixed at the frequency at the moment. The PLL circuit 42 outputs to the RF tuning circuit a tuning signal corresponding to the fixed local oscillator signal via the digital-to-analog converter 46. Capacitance of the variable capacitance diode 62 is varied according to the tuning signal to set the tuning frequency in the RF tuning circuit 20. Specifically, the tuning frequency in the RF tuning circuit is made 450 KHz smaller than the frequency of the local oscillator 22. The switch control circuit 44 outputs the control signal "L" to the switching circuit 40. The aperiodic signal inputted to the mixer 24 is switched to the tuned output signal. Then a, seek of the tuned output signal is started, so that tuning is switched from narrow band RF seek to the wide band RF seek (step 105).

Then the fine tuning circuit 52 automatically changes a 6-bit signal step by step in succession into a total of 64 kinds of digital signals. One of these digital signals and a 4-bit signal from the PLL circuit 42 are converted into an analog signal by the digital-to-analog converter 46, and are added to be applied to the RF tuning circuit. According to the digital signal from the fine tuning circuit 52, the tuning signal in the RF tuning circuit 20 is varied to perform automatic tracking (step 106).

The maximum value detector 58 monitors the signal strength to detect a peak point of the signal strength (step 107). When the maximum value detector 58 detects a peak point, it fixes not only the fine tuning signal of the fine tuning circuit 52 but also the tuning frequency of the RF tuning circuit 20 (step 108). Under this condition, station detection is resumed by detecting signal levels. SD detection for the tuned output signal is confirmed (step 109, called "narrow band SD detection").

Following the narrow band SD detection, presence or absence of cross modulation noises which are not detected during the wide band SD detection can be detected. Specifically, when SD is not detected in the narrow band but a peak having a signal level higher than the predetermined level is detected in the wide band, the peak value level remains "Low", thereby keeping the radio receiver from being ready for reception. When the narrow band SD is detected, the muting circuit is turned off, completing automatic tuning to start reception (step 110).

The tuning signal in the step 106, i.e., a coarse tuning voltage from the PLL circuit and a fine tuning voltage from the fine tuning circuit 52, will be described with reference to FIG. 6.

Figure 6:
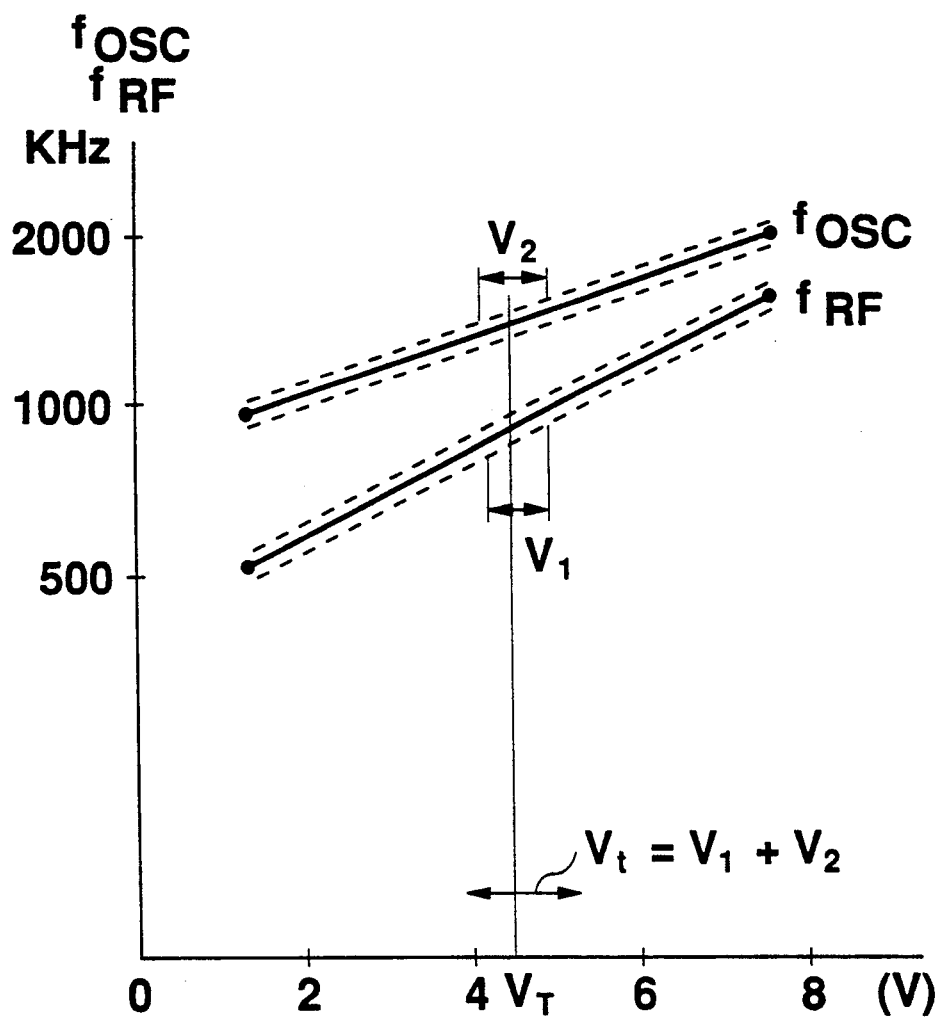
FIG. 6 shows characteristics of a resonance frequency $f_{RF}$ of an RF tuning circuit and a resonance frequency $f_{OSC}$ of a local oscillator versus a signal voltage outputted from a PLL circuit.

FIG. 6 shows the resonance frequency $f_{RF}$ of the RF tuning circuit 20 for the signal voltage outputted from the PLL circuit 42, and the resonance frequency $f_{OSC}$ of the local oscillator 22 (resonance circuit 74). The coarse tuning voltage $V_T$ necessary for obtaining the resonance frequencies $f_{RF}$ and $f_{OSC}$ is set to a value which is lower by a varying voltage $(V_1+V_2)$ caused by variable capacitance diodes 62, 76 in the RF tuning circuit 20 and the local oscillator circuit 22.

As described above, the fine tuning voltage $V_t$ of the fine tuning circuit 52 is made of the varying voltage $(V_1+V_2)$ which is converted into a 6-bit digital signal. The varying voltage $(V_1+V_2)$ is about 0.5 V, for example.

Figure 3:
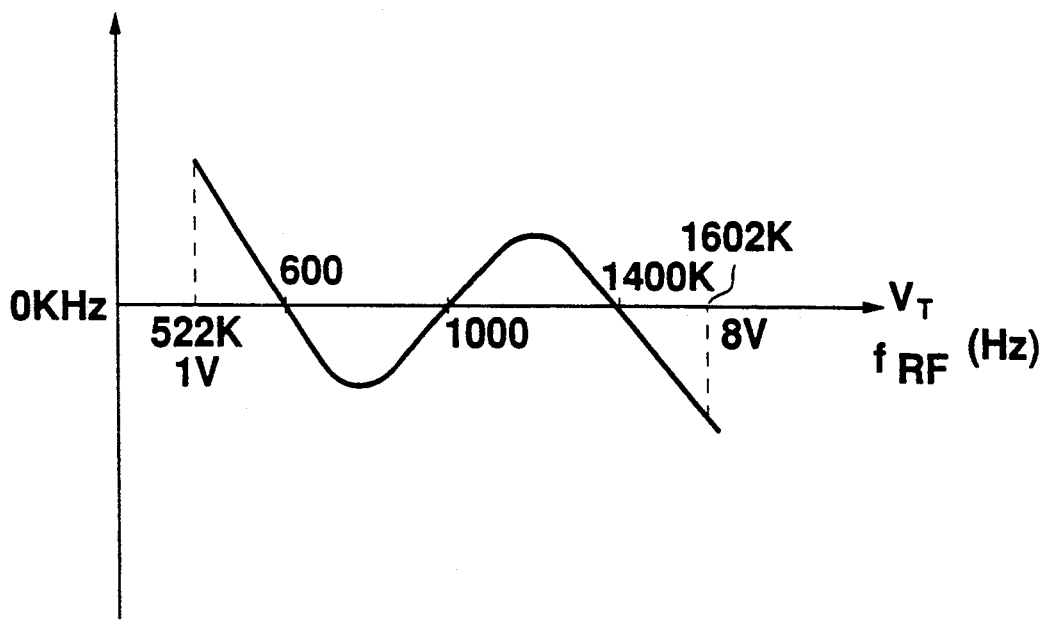
FIG. 3 shows displacement of an IF frequency.

The appropriate resonance frequencies $f_{RF}$, $f_{OSC}$ can be obtained according to the coarse tuning voltage $V_T$ and the fine tuning voltage $V_t$. Therefore, an IF signal of 450 KHz is obtained, no tracking error will occur in the RF tuning circuit shown in FIG. 3.

Figure 7:
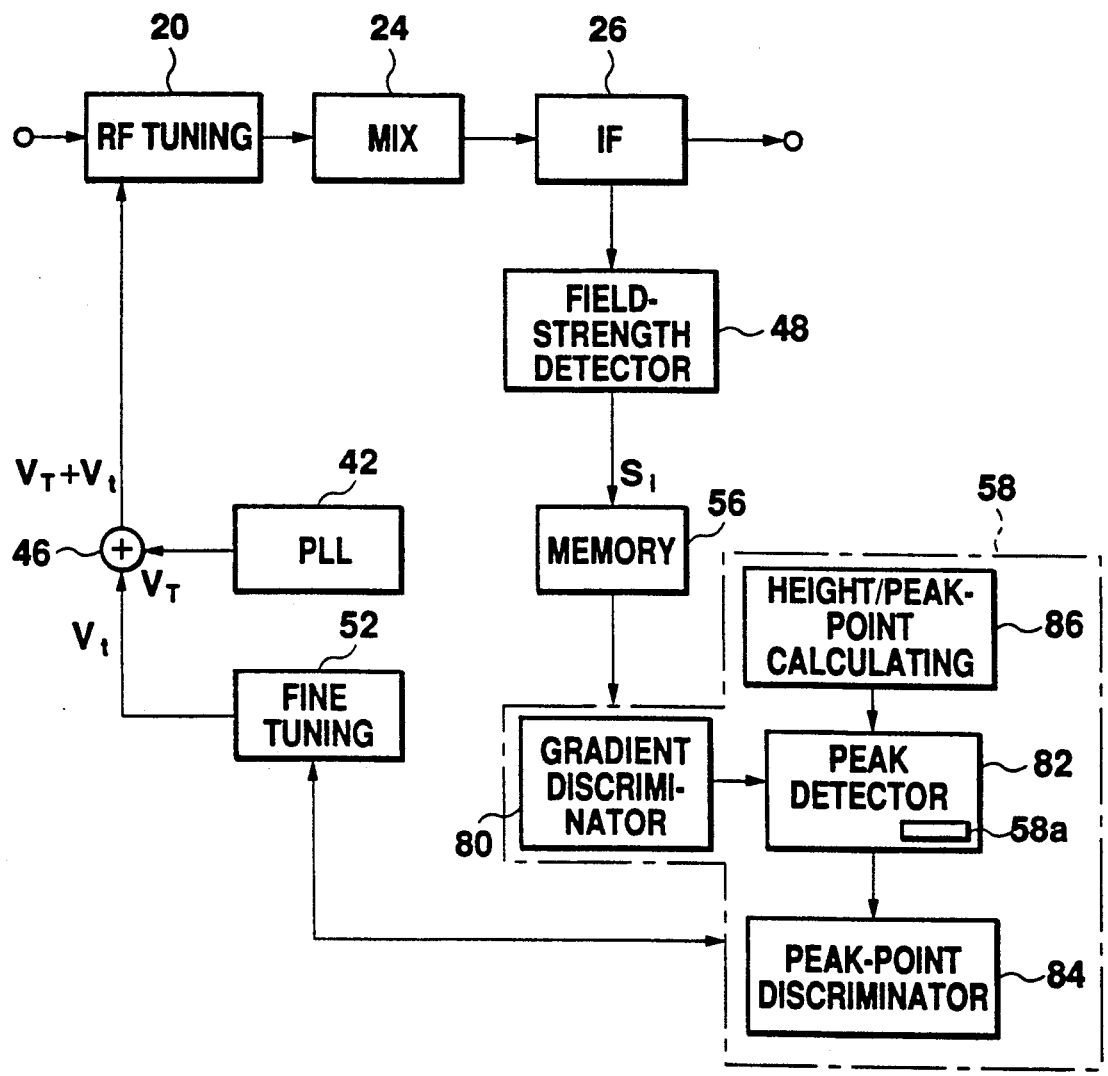
FIG. 7 is a circuit diagram of a peak detecting circuit in the embodiment of this invention.

The peak detector of this invention will now be described with reference to FIG. 7, in which components similar to or corresponding to those of FIG. 1 are assigned like reference numerals.

Figure 8A:
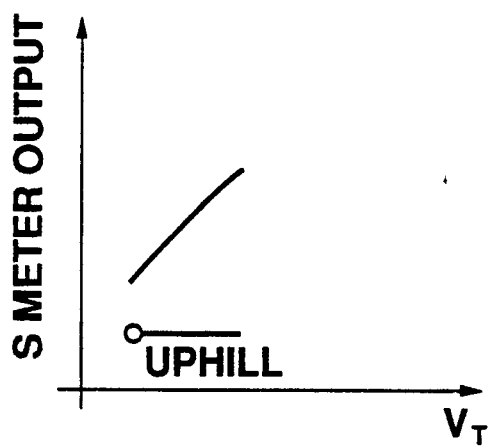
FIGS. 8(A) to 8(C) show change of signal strength for gradient discrimination.
Figure 8B:
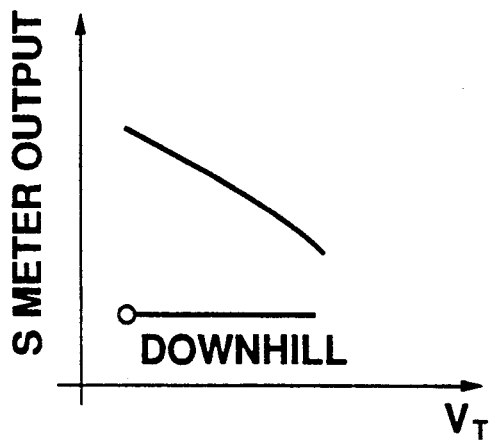
Figure 8C:
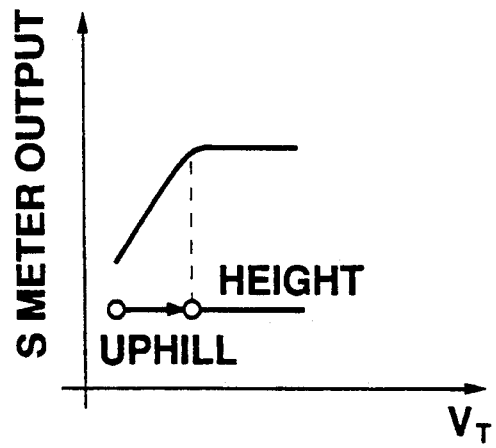

A gradient decision circuit 80 decides a gradient of change of the signal strength based on the signal strength obtained from the electric field strength detector 48 at the time of fine tuning. Specifically, the gradient decision circuit 80 reads S meter values step by step, e.g. S meter value Si for the electric field strength of the i-th fine tuning, according to the tuning signal $V_t$ varied by the fine tuning circuit 52. As shown in FIG. 8(A), when the gradient $(S_{i+1}-S_i)$ of the S meter value is "positive", it is decided to be uphill. When the gradient $(S_{i+1}-S_i)$ is "negative", it is decided to be downhill. When the gradient changes from $(S_i-S_{i-1})>0$ to $(S_{i+1}-S_i)=0$, it is decided to be "horizontal", as shown in FIg. 8(C).

Figure 9A:
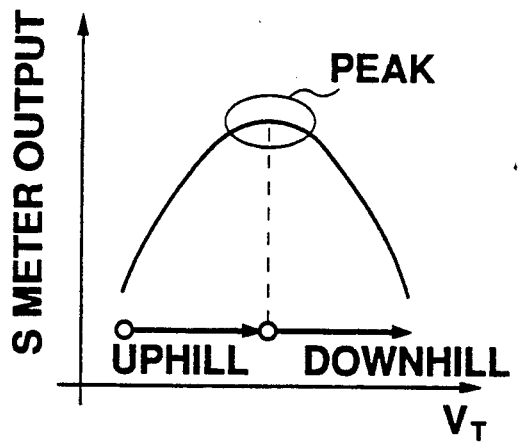
FIGS. 9(A) to 9(C) show change of the signal strength for peak detection.
Figure 9B:
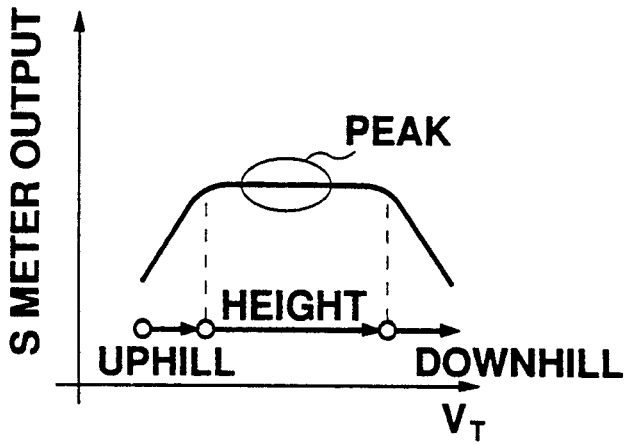
Figure 9C:
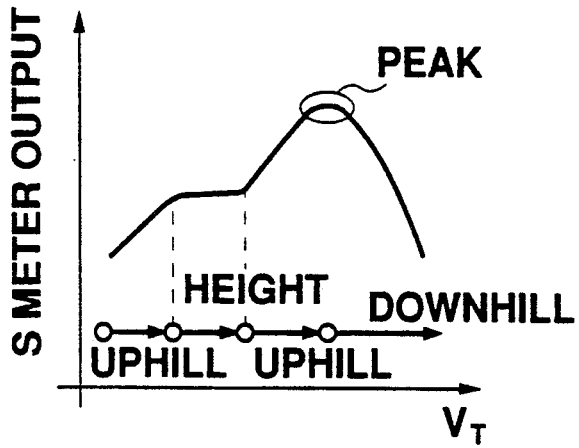

As shown in FIG. 9(A), the peak whose gradient changes from "positive" to "negative" is decided to be mount-like. The peak whose gradient changes from "horizontal" to "negative" is decided to be trapezoidal as shown in FIG. 9(B). However, when the peak whose gradient changes from "horizontal" to "positive" is not decided to be trapezoidal.

Figure 10A:
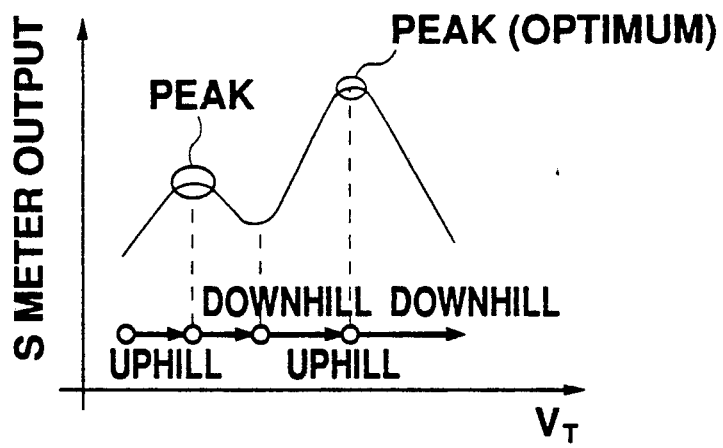
FIGS. 10(A) to 10(C) show change of the signal strength for maximum peak point discrimination.
Figure 10B:
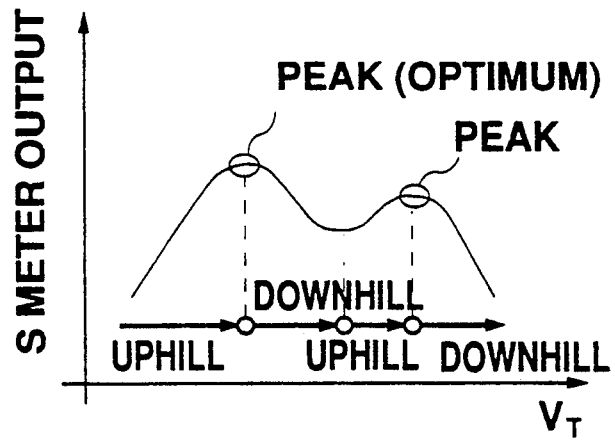
Figure 10C:
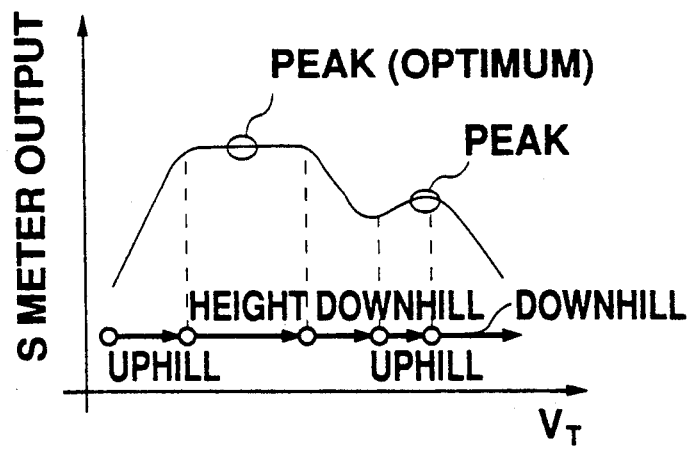

A peak discriminating circuit 84 discriminates an apex of the mount-like or trapezoidal peak as described above. Specifically, when there are a plurality of peaks as shown in FIGS. 10(A) to 10(C), the apex is selected and is stored in the memory 58a.

Figure 11:
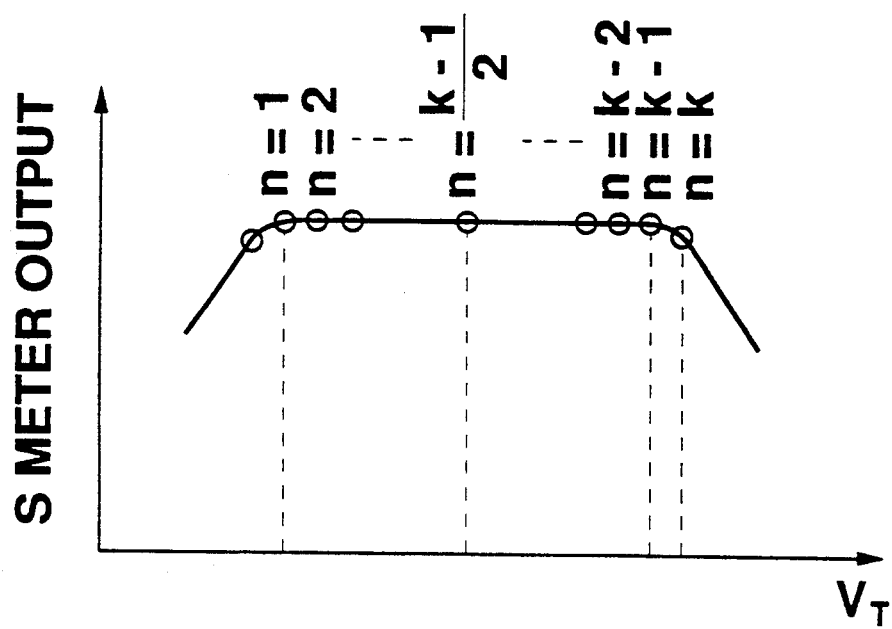
FIG. 11 shows variation of the signal strength indicating a trapezoidal peak point.

A trapezoidal peak calculator 86 calculates a central point of the trapezoidal peak, and determines it. Specifically, as shown in FIG. 11, as soon as the gradient changes from "positive" to "0", n is counted up in synchronization with the fine tuning timing. Then, when the gradient changes "0" to "negative", (k=1) is subtracted from n=k to be corrected. The trapezoidal peak count value n is halved to calculate the trapezoidal peak (k−1)/2.

Figure 12A:
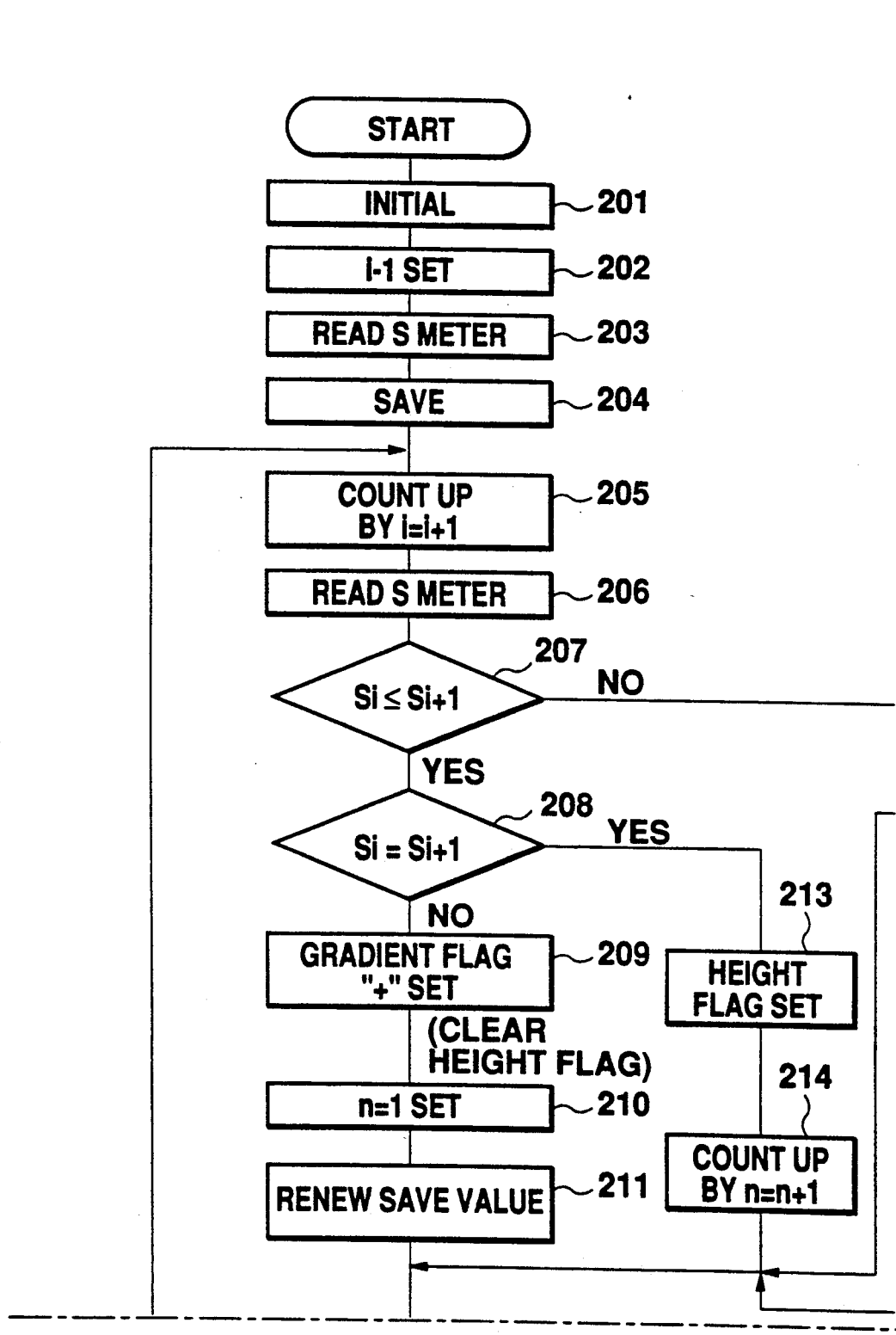
FIG. 12A FIG. 12B and FIG. 12C show a flow chart showing the peak detecting sequence according to this invention.
Figure 12B:
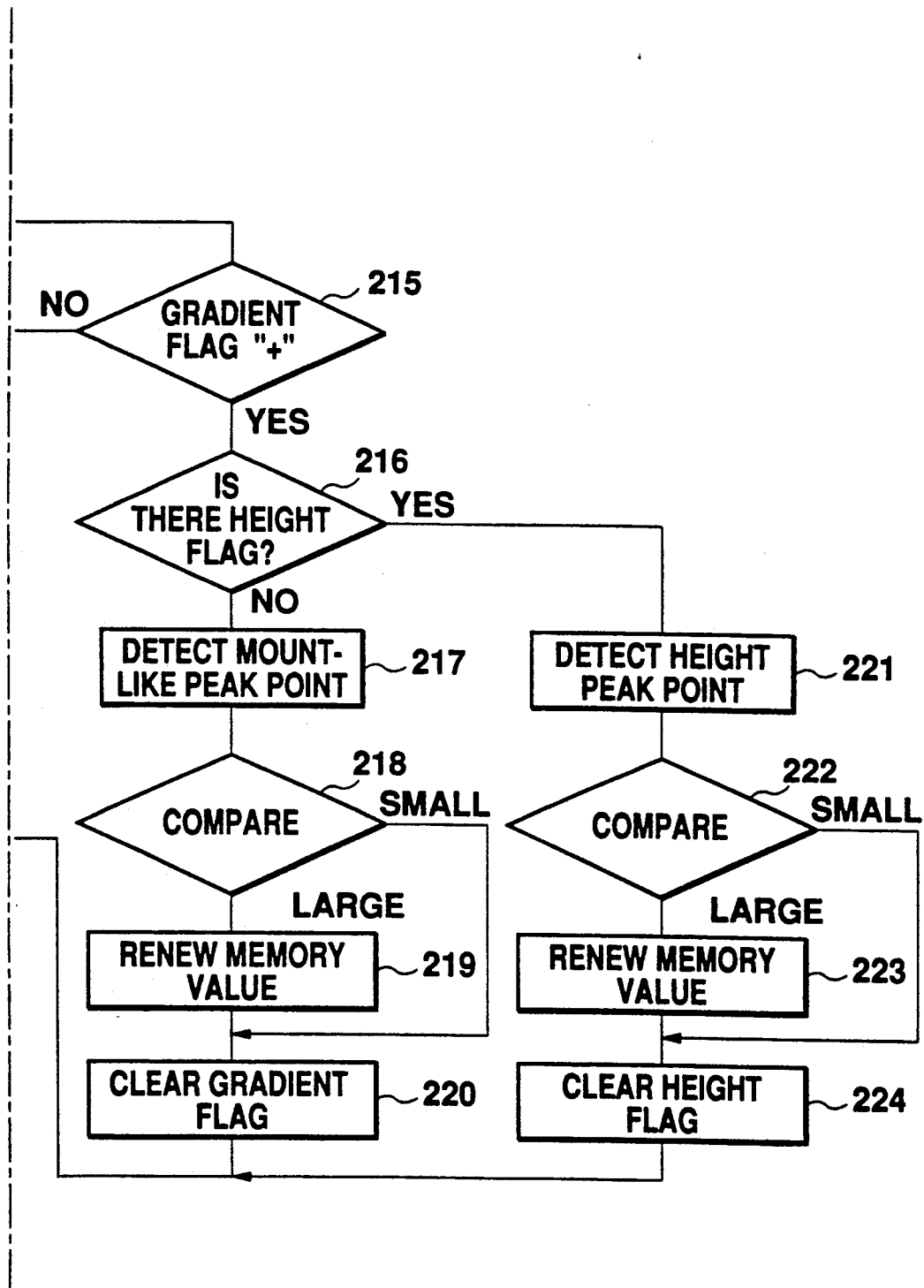
Figure 12C:
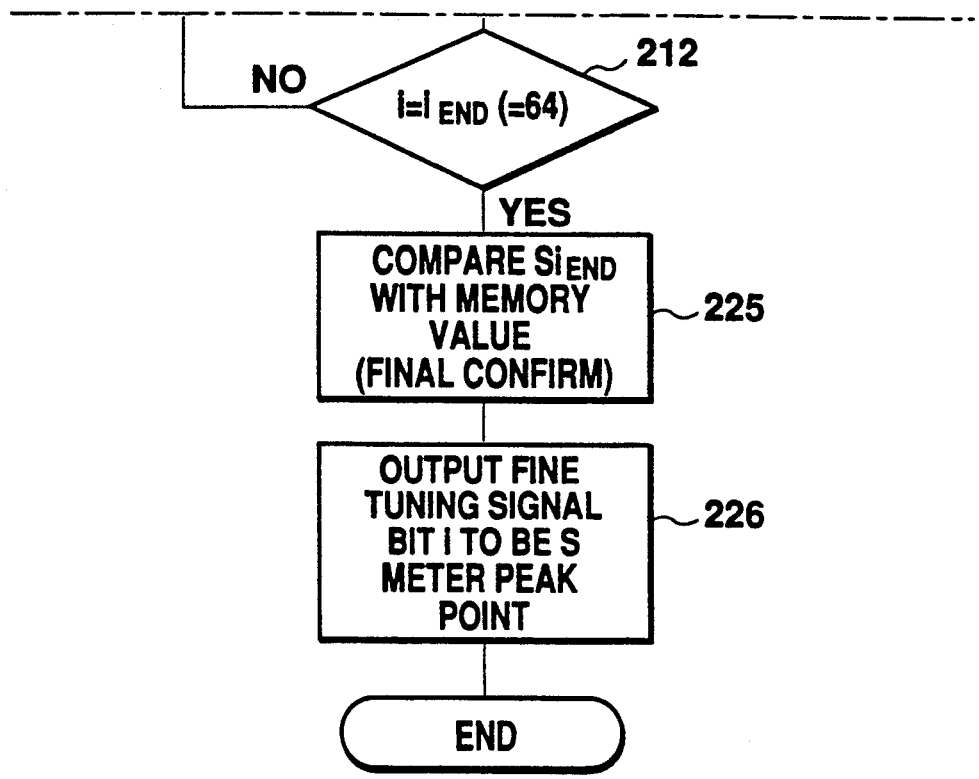

The peak detecting sequence will be described referring to the flow chart of FIGS. 12A, 12B and 12C.

Firstly, the peak detector is initialized (step 201), being set for the fine tuning number i=1 (step 202). Secondly, the S meter value Si is read (step 203). Si is stored in the memory 58 and the detection memory 58a (step 204).

Si is counted up by i=i+1 in synchronization with the fine tuning timing (205). Then the S meter value will be read (step 206). Whether the read S-meter value is $S_i = S_{i+1}$ is checked (step 207). If YES, $S_i = S_{i+1}$ is checked (step 208). Otherwise, a gradient flag is set to "+" (step 209) to set the trapezoidal peak count value to n=1 (step 210). When the gradient flag is set in the step 209, the trapezoidal flag is cleared.

The contents in the memory 58a are changed to $S_i$ from $S_{i+1}$ (step 211). Completion of fine tuning is checked by $i = i_{END}$, i.e. i=64 (step 212). If NO, the sequence is returned to the step 205.

On the other hand, if YES in the step 208, the trapezoidal flag is set (step 213). The trapezoidal peak count value is counted up by n=n+1 (step 214), and the sequence is returned to the step 212.

When judged NO in the step 207, i.e. when the gradient is "negative", presence or absence of the flag "+" is checked (step 215). On the contrary, when judged YES, presence or absence of the height flat is checked (step 216). If NO, i.e. if the gradient changes from "positive" to "negative", a mount-like peak is detected (step 217), and is compared with the S meter value stored in the memory 58a (step 218). When the present mount-like peak is large, the value saved in the memory 58a is renewed (step 219), and the gradient flag "+" is cleared (step 220). Then the sequence is returned to the step 212.

When the trapezoidal flag is detected in the step 216, the central point of the trapezoidal peak is calculated by using the trapezoidal peak count value n (step 221), and is compared with the S meter value stored in the memory 58a (step 222). When this trapezoidal peak is large, the value saved in the memory 58a is renewed (step 223), the height flag is cleared (step 224), and sequence is returned to the step 212.

Thereafter, when $i = i_{END}$ is judged in the step 212, the last detected peak value is compared with the value saved in the memory 58 (step 225). A larger value is selected, DAC setting bit for the S meter peak, i.e. fine tuning signal $V_{ti}$, is outputted (step 226), completing the automatic tuning sequence.

In the foregoing embodiment, this invention is applied to an AM radio receiver as an example. However, the peaking detecting circuit of this invention is applicable to FM or double conversion system radio receivers as well as the AM radio receiver.

What is claimed is:

1. A circuit for detecting an optimum peak point signal strength in an automatic tuning circuit for automatically tuning in to a broadcasting station having a signal strength greater than a predetermined value, said detecting circuit comprising:

(a) an RF tuning circuit for output a received signal in a tuned state;

(b) an RF non-tuning circuit for output said received signal in a non-tuned state;

(c) a local oscillator circuit for outputting a local oscillator signal;

(d) a tuned frequency variable circuit for varying, by predetermined changing steps, the frequency of said received signal transmitted by said RF tuning circuit and the frequency of the local oscillator signal of said local oscillator circuit;

(e) a selector circuit for selecting a first output signal of said RF non-tuning circuit during the automatic tuning and for selecting a second output signal of said RF tuning circuit after termination of the automatic tuning;

(f) a signal strength detector for detecting the signal strength of the received signal;

(g) a fine tuning circuit for varying, the tuned frequency of said second output signal of said RF tuning circuit after termination of the automatic tuning within the changing steps in said tuned frequency variable circuit;

(h) a gradient decision circuit for deciding a gradient of change of said signal strength based on the signal strength obtained from said signal strength detector when the tuned frequency is varied by said fine tuning circuit;

(i) a peak detector for detecting one or more peaks of the signal strength based on the result of the decision of said gradient decision circuit; and (j) a peak discriminating circuit for discriminating an optimum peak point among the peaks detected by said peak detector.

2. A signal-strength-peak-point detecting circuit according to claim 1, further comprising means for deciding whether the signal strength detected by said signal strength detector in one resonance frequency in said tuned frequency variable circuit is greater than a predetermined value, said deciding means being operable to activate said fine tuning circuit when the result of decision by said gradient decision circuit is greater than the predetermined value.

3. A signal-strength-peak-point detecting circuit according to claim 1, wherein when the peak is decided to be trapezoidal in shape as the result of the decision by said gradient decision circuit, said peak discriminating circuit discriminates a central point of an upper side of the trapezoid as an optimum peak.

4. A signal-strength-peak-point detecting circuit according to claim 1, wherein when the peak is decided to be rounded in shape as the result of the decision by said gradient decision circuit, said peak discriminating circuit discriminates an apex of the rounded peak as an optimum peak.

5. A signal-strength-peak-point detecting circuit according to claim 1, wherein when the peak is decided to have both trapezoidal and rounded characteristics as the result of the decision by said gradient decision circuit, said peak discriminating circuit discriminates one of two peaks formed by the combination of the trapezoidal and rounding characteristics whose maximum value is greater as an optimum peak.

6. A signal-strength-peak-point detecting circuit according to claim 1, further including an analog-to-digital converter for converting the result of detection by said signal strength detector into digital data, and a memory for storing output digital data of said analog-to-digital converter, said gradient decision circuit being operable to read and compare the data from said memory to decide the gradient.

7. A signal-strength-peak-point detecting circuit according to claim 6, wherein when the peak is decided to be trapezoidal in shape as the result of the decision by said gradient decision circuit, said peak discriminating circuit discriminates a central point of an upper side of the trapezoid as an optimum peak.

8. A signal-strength-peak-point detecting circuit according to claim 6, wherein when the peak is decided to be rounded in shape as the result of the decision by said gradient decision circuit, said peak discriminating circuit discriminates an apex of the rounded peak as an optimum peak.

9. A signal-strength-peak-point detecting circuit according to claim 6, wherein when the peak is decided to have both trapezoidal and rounded characteristics as the result of the decision by said gradient decision circuit, said peak discriminating circuit discriminates one of two peaks formed by a combination of the trapezoidal and rounded characteristics whose maximum value is greater as an optimum peak.

* * * * *